US007816980B2

(12) United States Patent
Park

(10) Patent No.: US 7,816,980 B2
(45) Date of Patent: Oct. 19, 2010

(54) AUDIO POWER AMPLIFIER USING VIRTUAL GROUND AND METHOD OF PROCESSING SIGNAL IN THE AUDIO POWER AMPLIFIER

(75) Inventor: Hae-kwang Park, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 739 days.

(21) Appl. No.: 11/778,707

(22) Filed: Jul. 17, 2007

(65) Prior Publication Data

US 2008/0211577 A1 Sep. 4, 2008

(30) Foreign Application Priority Data

Mar. 2, 2007 (KR) ...................... 10-2007-0021149

(51) Int. Cl.
*H03F 3/38* (2006.01)
(52) U.S. Cl. ..................... 330/10; 330/251; 330/207 A; 375/238; 381/120; 381/121
(58) Field of Classification Search ................... 330/10, 330/251, 207 A; 375/238; 381/120, 121
See application file for complete search history.

(56) References Cited

U.S. PATENT DOCUMENTS 6,166,596 A * 12/2000 Higashiyama et al. ........ 330/10

6,300,826 B1 10/2001 Mathe et al.
7,239,200 B2 * 7/2007 Ishii et al. ..................... 330/10

FOREIGN PATENT DOCUMENTS

EP 1 630 965 A 3/2006
WO WO 2006/059956 A 6/2006

OTHER PUBLICATIONS

European Search Report issued Aug. 14, 2008 (EP 07119193.6).

* cited by examiner

*Primary Examiner*—Michael B Shingleton
(74) *Attorney, Agent, or Firm*—Stanzione & Kim LLP

(57) ABSTRACT

An audio power amplifier provides a virtual ground to reduce power on/off noise and a method for processing a signal in the audio power amplifier. The audio power amplifier includes a switching amplifier to amplify a small output pulse width modulation (PWM) signal so as to generate a large output PWM signal, a pulse generating unit to generate a pulse signal having the same level as that of the PWM signal level, a first low pass filter to allow the large output PWM signal amplified by the switching amplifier to be low-pass filtered so as to restore the PWM signal to an audio signal, and a second low pass filter to allow the pulse signal generated by the pulse signal generating unit to be low-pass filtered so as to convert the pulse signal into a virtual ground voltage with respect to the restored audio signal.

20 Claims, 4 Drawing Sheets

AUDIO POWER AMPLIFIER USING VIRTUAL GROUND AND METHOD OF PROCESSING SIGNAL IN THE AUDIO POWER AMPLIFIER

CROSS-REFERENCE TO RELATED APPLICATIONS

This application claims the benefit of Korean Patent Application No. 10-2007-0021149, filed on Mar. 2, 2007, in the Korean Intellectual Property Office, the disclosure of which is incorporated herein in its entirety by reference.

BACKGROUND OF THE INVENTION

1. Field of the Invention

The present general inventive concept relates to an audio power amplifier usable with an audio power amplifier system, and more particularly, to an audio power amplifier that provides a virtual ground to reduce power on/off noise in an audio power amplifier system, and a method of processing a signal in the audio power amplifier.

2. Description of the Related Art

Generally, an audio power amplifier is used in a digital audio system. Class A, class B, class AB and class D are used as an audio power amplifier. Among them, the class D amplifier can reduce drops in amplification efficiency which occur in class A, class B, and class AB amplifiers. The class D amplifier uses a method of converting an audio signal into a pulse width modulation (PWM) signal using on and off switching of a switching circuit. Accordingly, the class D amplifier does not have data conversion loss, and a nonlinear component occurring in the analog part, from which the switching circuit is started, is overcome. Generally, an audio system using such a power amplifier is composed of a microcomputer controlling the entire system, a digital signal processor processing a digital signal, a PWM unit generating a PWM signal by comparing an audio signal and a carrier signal, and a power stage unit amplifying the voltage and current of the PWM signal using a power switch. The power stage unit is composed of a switching field-effect transistor (FET) and an output filter.

FIG. 1A is a circuit diagram illustrating a conventional switching FET.

In the switching FET, an n-type metal-oxide-semiconductor (NMOS) transistor $Q_N$ and a p-type metal-oxide-semiconductor (PMOS) transistor $Q_P$ are alternately and repeatedly turned on/off so as to output a pulse waveform having a large output as illustrated in FIG. 1B.

The pulse waveform illustrated in FIG. 1B passes through a carrier frequency removing LC filter which is a combination of an inductor L5 and a capacitor C62, as illustrated in FIG. 2, so as to be converted into an audio signal. The waveform converted at this time has a direct current (DC) value of VDD/2.

While the converted audio signal passes through a DC removing capacitor C60, a DC value is removed. Accordingly, the audio signal passes through an electromagnetic interface (EMI) removing filter 210 so as to be provided to a speaker or a headset.

The DC removing capacitor C60 is used in a conventional power stage output filter illustrated in FIG. 2 for removing DC. However, the capacity of the DC removing capacitor C60 may be increased in order to achieve audio band properties (low frequency properties).

The DC removing capacitor C60 for increasing the low frequency properties may generate a noise component such as a popping sound.

In conventional audio power amplifier arts, since a common ground is connected in a long line connecting devices such as an earphone and a speaker, EMI properties may deteriorate. In addition, since grounds having different properties are connected, a hum may occur.

SUMMARY OF THE INVENTION

The present general inventive concept provides an audio power amplifier usable with an audio power amplifier system, and a device and a method of processing a signal in the audio power amplifier, in which a pulse signal for a virtual ground is used in a power stage to reduce a popping sound or power on/off noise.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an audio power amplifier including a switching amplifier to amplify a first output pulse width modulation (PWM) signal so as to generate a second output PWM signal, a pulse generating unit to generate a pulse signal having the same level as that of the PWM signal, a first low pass filter to low-pass filter the second output PWM signal amplified by the switching amplifier to restore the second PWM signal to an audio signal, a second low pass filter to low-pass filter the pulse signal generated by the pulse signal generating unit to convert the pulse signal into a virtual ground voltage with respect to the restored audio signal, and a controlling unit to gradually adjust a width of the pulse signal generated by the pulse signal generating unit.

The foregoing and/or other aspects and utilities of the present general inventive concept may be achieved by providing an audio power amplifier system, including a switching amplifier to generate a pulse width modulation (PWM) signal, a pulse generating unit to generate a pulse signal, a first low pass filter to low-pass filter the PWM signal to generate an audio signal, and a second low pass filter to low-pass filter the pulse signal to convert the pulse signal into a virtual ground voltage to be applied to the first low pass filter.

The pulse signal may have a variable pulse width; the virtual ground voltage is variable according to the variable pulse width, and the first low pass filter may generate the restored audio signal according to the variable virtual ground voltage.

The pulse signal may have a pulse width which is increased according to a power on signal, and the first low pass filter may include a capacitor applied with the virtual ground voltage generated according to the increased pulse width to remove a noise from the restored audio signal.

The pulse signal may have a pulse width which is decreased according to a power off signal, and the first low pass filter may include a capacitor applied with the virtual ground voltage generated according to the decreased pulse width to remove a noise from the restored audio signal.

The pulse signal may have a variable duty ratio according to a power on and/or off signal, and the first low pass filter may include a capacitor applied with the virtual ground voltage generated according to the variable duty ratio to remove a noise from the restored audio signal.

The pulse signal may have the same voltage level as the PWM signal.

The audio power amplifier system may further include a controlling unit to generate a signal such that the PWM signal and the pulse signal are synchronized.

The audio power amplifier system may further include a controlling unit to synchronize the switching amplifier and the pulse generating unit to simultaneously generate the PWM signal and the pulse signal.

The audio power amplifier system may further include a controlling unit to control the switching amplifier and the pulse generating unit such that the virtual ground voltage is applied to the audio signal to remove a pop-up noise from the audio signal The audio power amplifier system may further include a load unit connected to the first low pass filter to receive the audio signal generated according to the virtual ground voltage, and to produce sound corresponding to the received audio signal.

The first low pass filter may include a first inductor and a first capacitor to generate the restored audio signal from the PWM signal, and the first low pass filter may include a second inductor and a second capacitor to generate the virtual ground voltage from the pulse signal, and to apply the generated virtual ground voltage to the first capacitor.

The pulse signal may include pulses having gradually varying widths; the virtual ground voltage is adjusted according to the pulses, the first low pass filter may include a first capacitor to generate the restored audio signal from the PWM signal, and the first low pass filter may include a second capacitor to generate the adjusted virtual ground voltage from the pulses having the gradually varying widths, and to apply the generated adjusted virtual ground voltage to the first capacitor to remove a DC component therefrom.

The foregoing and/or other aspects and utilities of the present general inventive concept may be achieved by providing a method of an audio power amplifier system, the method including generating a pulse width modulation (PWM) signal, generating a pulse signal, low-pass filtering the PWM signal to generate an audio signal, and low-pass filtering the pulse signal to convert the pulse signal into a virtual ground voltage to be applied to the low pass filtering of the PWM signal.

The foregoing and/or other aspects and utilities of the present general inventive concept may be achieved by providing a computer-readable medium containing computer-readable codes as a program to execute a method of an audio power amplifier system, the method including generating a pulse width modulation (PWM) signal, generating a pulse signal, low-pass filtering the PWM signal to generate an audio signal, and low-pass filtering the pulse signal to convert the pulse signal into a virtual ground voltage to be applied to the low pass filtering of the PWM signal.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
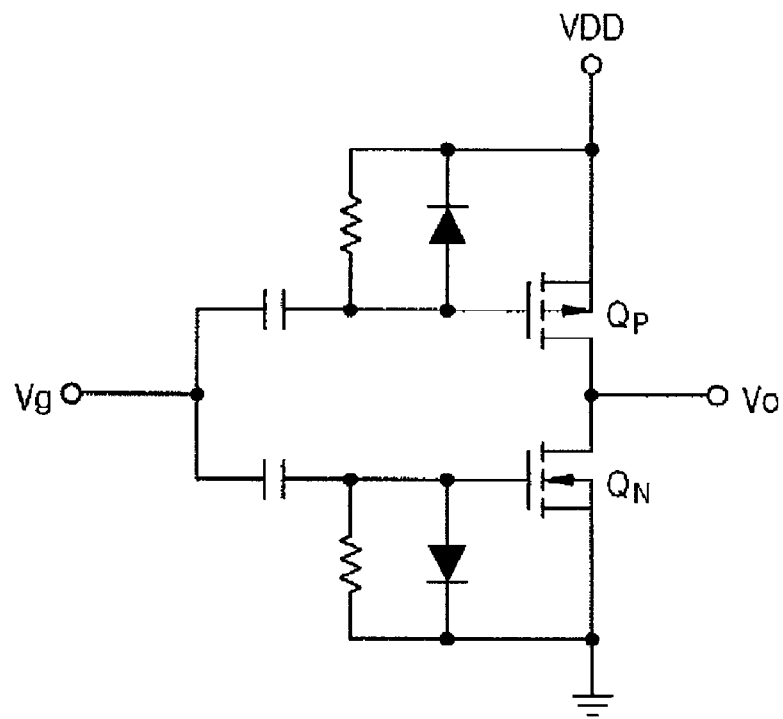
FIG. 1A is a circuit diagram illustrating a conventional switching field-effect transistor (FET)
Figure 1B:
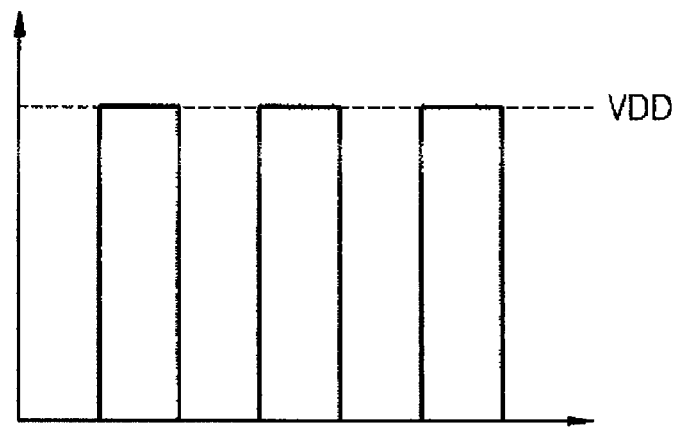
FIG. 1B is a waveform diagram output by the switching FET illustrated in FIG. 1A.
Figure 2:
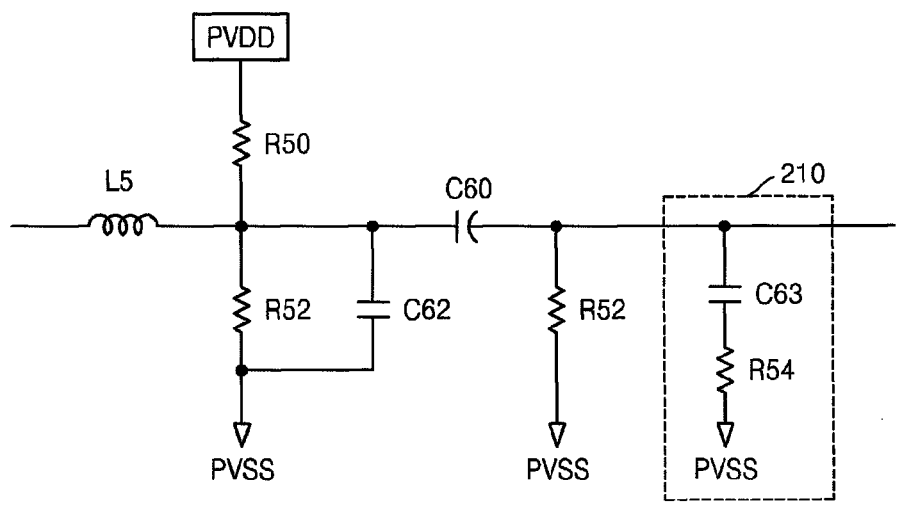
FIG. 2 is a view illustrating a conventional output filter of a power stage unit.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
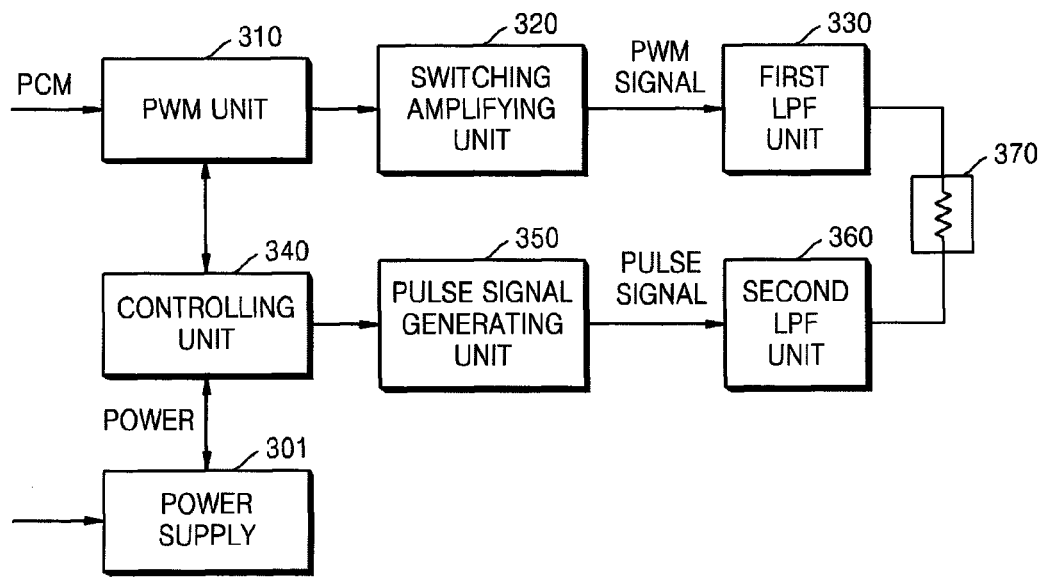
FIG. 3 is a block diagram illustrating an audio power amplifier system according to an embodiment of the present general inventive concept.

FIG. 3 is a block diagram illustrating an audio power amplifier system according to an embodiment of the present general inventive concept.

Referring to FIG. 3, the audio power amplifier system includes a pulse width modulation (PWM) unit 310, a switching amplifying unit 320, a first low pass filter (LPF) unit 330, a controlling unit 340, a pulse signal generating unit 350, a second LPF unit 360 and a loading unit 370.

The PWM unit 310 compares an input Pulse Code Modulation (PCM) audio signal level or an analog audio signal level with a carrier signal level to convert a PCM signal to a first output PWM signal.

The switching amplifying unit 320 power-amplifies the first output PWM signal converted by the PWM unit 310 into a second output PWM signal using power provided by a power supply 301. For example, the switching amplifying unit 320 amplifies the first output PWM signal of about 3.3 V into the second output PWM signal in the range of 5 to 40 V.

The second output PWM signal is an amplified signal of the first output PWM signal, and is greater than the first output PWM signal in signal level, amplitude, and/or audio characteristic. The second output PWM signal may be referred to as a large output PWM signal, and the first output PWM signal may be referred to as a small output PWM signal, hereinafter.

The pulse signal generating unit 350 generates a pulse signal having the same high and low levels as those of the PWM signal according to a pulse controlling signal of the controlling unit 340. At this time, the pulse signal has a duty ratio of 50%.

The first LPF unit 330 allows the large output PWM signal amplified by the switching amplifying unit 320 to be low-pass filtered so as to restore the PWM signal to an audio signal.

The second LPF unit 330 allows the pulse signal generated by the pulse signal generating unit 350 to be low-pass filtered so as to convert the pulse signal to a virtual ground voltage with respect to the restored audio signal. For example, when the duty ratio of the pulse signal is 50%, and a peak voltage is $V_p$, a voltage applied to the second LPF unit 330 becomes $V_p/2$.

The controlling unit 340 generates the pulse controlling signal by detecting an on and/or off power of the power supply 301. In particular, according to the detected on/off power, the pulse width of the pulse signal generating unit 350 is adjusted, i.e., gradually (progressively) adjusted. That is, the pulse width of the pulse signal generating unit 350 is reduced or increased. In addition, the controlling unit 340 can control the initialization of the first output PWM signal of the PWM unit 310 by transmitting a signal to the PWM unit 310.

The power supply 301 may supply power to the controlling unit such that the controlling unit detects the on and/or off power of the power supply 301 according to the supplied power. It is possible that the power supply 301 may transmit a signal corresponding to the on and/or off power to the controlling unit 340. Accordingly, the controlling unit 340 can control the PWM unit 310 and the pulse signal generating unit 350 to generate the first output PWM signal and the pulse signal, respectively, in a timely manner, that is, to be synchronized, such that the low-pass filtered signal corresponding to the adjusted pulse width is added to the audio signal according to the on and/or off power of the power supply 301, to remove a pop-up noise or a power on/off noise from the audio signal.

The loading unit 370 corresponds to a speaker or an earphone, and generates the audio signal restored by the first LPF unit 330 using the virtual ground set by the second LPF unit 330. That is, if the peak voltage $V_P$ of the pulse signal generated by the pulse signal generating unit 350 is the same as the PWM signal level output by the switching amplifying unit 320, a DC value is not applied to the loading unit 370 due to the virtual ground voltage generated by the second LPF unit 330.

Alternatively, the large output PWM signal amplified by the switching amplifying unit 320 may be directly transferred to the loading unit 370.

Figure 4A:
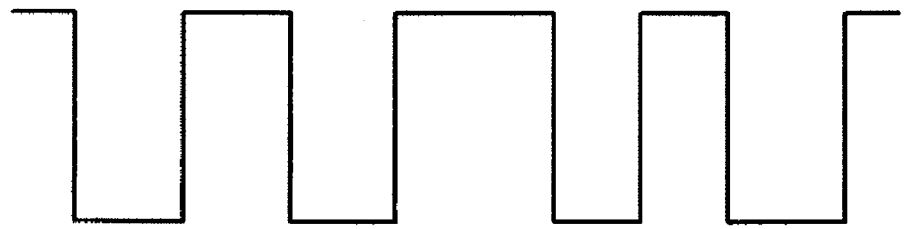
FIG. 4A is a waveform diagram of a pulse width modulation (PWM) signal generated by a switching amplifying unit of the audio power amplifier system illustrated in FIG. 3.

FIG. 4A is a waveform diagram illustrating the second output PWM signal generated by the switching amplifying unit 320 illustrated in FIG. 3.

Figure 4B:
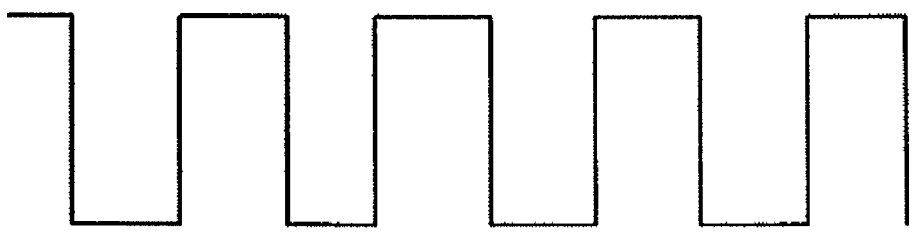
FIG. 4B is a waveform diagram of the pulse signal for the virtual ground generated by a pulse signal generating unit of the audio power amplifier system illustrated in FIG. 3.

FIG. 4B is a waveform diagram illustrating the pulse signal for the virtual ground generated by the pulse signal generating unit 350 illustrated in FIG. 3.

Referring to FIG. 4B, the pulse signal generated by the pulse signal generating unit 350 has the same level as that of the PWM signal illustrated in FIG. 3.

Figure 5:
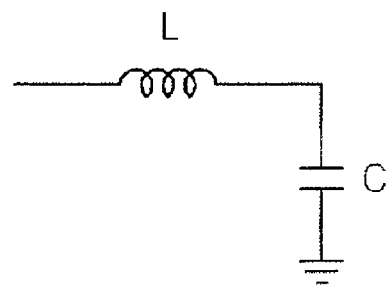
FIG. 5 is a circuit diagram illustrating a first low pass filter (LPF) unit and/or a second LPF unit of the audio power amplifier system illustrated in FIG. 3.

FIG. 5 is a circuit diagram illustrating the first LPF unit 330 and/or the second LPF unit 330 illustrated in FIG. 3.

Referring to FIG. 5, the first LPF unit 330 and/or the second LPF unit 330 includes an inductor L and a capacitor C, and removes a high frequency component with respect to a signal that is output by the switching amplifying unit 360 or the pulse signal generating unit 350 so as to convert the high frequency component into DC. At this time, the first LPF unit 330 has a cut off frequency f_c as given by Equation 1.

$$f\_c = \frac{1}{2\pi \sqrt{LC}}$$  Equation 1

Figure 6:
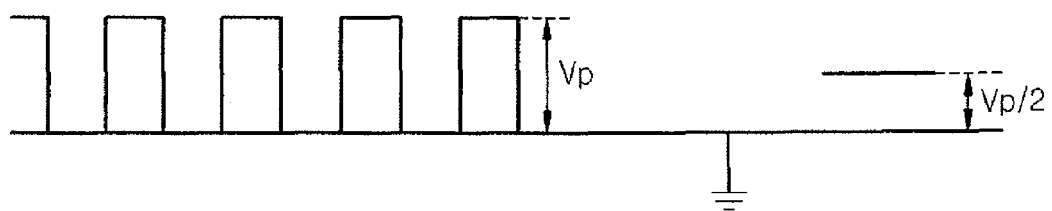
FIG. 6 is a waveform diagram illustrating input and output signals of a second LPF unit of the audio power amplifier system illustrated in FIG. 3.

FIG. 6 is a waveform diagram illustrating input and output signals of the second LPF unit 330 illustrated in FIG. 3.

Referring to FIG. 6, when the pulse signal for the virtual ground is applied to the second LPF unit 330, the pulse signal for the virtual ground is converted into a DC signal. That is, when the duty ratio of the pulse signal for the virtual ground is 50%, and the peak voltage is $V_p$, a voltage applied to the second LPF unit 330 becomes $V_P/2$. At this time, when the peak voltage $V_P$ is the same as the PWM signal that is output by the first LPF unit 330, a DC component is not applied to the loading unit 370 illustrated in FIG. 3. Since only an audio signal corresponding to an AC component is applied to the loading unit 370, there is no need for an additional capacitor for blocking DC.

Figure 7A:
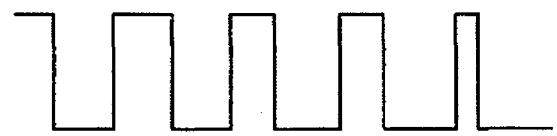
FIGS. 7A and 7B are waveform diagrams of a pulse signal for a virtual ground when a power is switched on or off.
Figure 7B:
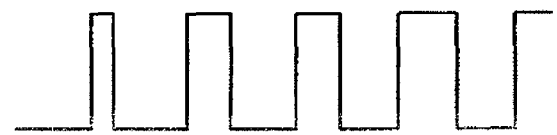

FIGS. 7A and 7B are waveform diagrams illustrating a pulse signal for a virtual ground when a power is switched on or off.

When the power is switched on or off, the capacitor C used in the second LPF unit 330 generates a popping sound due to charging/discharging. Accordingly, referring to FIGS. 7A and 7B, when the power is off, the pulse width of the pulse signal is gradually reduced so as to slowly discharge the capacitor C. When the power is on, the pulse width of the pulse signal is gradually increased so as to slowly charge the capacitor C.

The present general inventive concept can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to the present general inventive concept as described above, by using a pulse signal for a virtual ground in a power stage of an audio power amplifier, a popping sound can be removed and frequency response properties can be improved. In addition, high sound quality can be achieved by removing an electrolytic capacitor from a signal line.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An audio power amplifier usable with an audio power amplifier system, comprising:
    a switching amplifier to amplify a first output pulse width modulation (PWM) signal to generate a second output PWM signal;
    a pulse generating unit to generate a pulse signal having the same level as the second output PWM signal;
    a first low pass filter to low-pass filter the second output PWM signal amplified by the switching amplifier to restore the second PWM signal to an audio signal; and
    a second low pass filter low-pass filter the pulse signal generated by the pulse signal generating unit to convert the pulse signal into a virtual ground voltage with respect to the restored audio signal.

2. The audio power amplifier of claim 1, further comprising:
    a controlling unit to gradually increase or reduce a width of the pulse signal generated by the pulse signal generating unit.

3. The audio power amplifier of claim 1, wherein the pulse signal of the pulse signal generating unit has a duty ratio of 50%.

4. An audio power amplifier system, comprising:
    a PWM unit to compare an audio signal with a reference carrier signal to generate a first output PWM signal;

- a switching amplifying unit to amplify the first output PWM signal generated by the PWM unit to generate a second output PWM signal;
- a pulse signal generating unit to generate a pulse signal having the same level as the second output PWM signal;
- a first low pass filter to low-pass filter the second output PWM signal amplified by the switching amplifier to restore the filtered second output PWM signal to an audio signal;
- a second low pass filter to low-pass filter the pulse signal generated by the pulse signal generating unit to convert the pulse signal into a virtual ground voltage with respect to the restored audio signal; and
- a controlling unit to control a pulse width of the pulse signal generating unit according to on/off power.

5. A method of processing an audio power amplifier system, the method comprising:
- comparing an audio signal with a reference carrier signal to generate a first output PWM signal;
- amplifying the first output PWM signal to generate a second output PWM signal;
- generating a pulse signal having the same level as the second output PWM signal;
- low-pass filtering the second output PWM signal to restore the second output PWM signal to an audio signal; and
- low-pass filtering the pulse signal to convert the pulse signal into a virtual ground voltage with respect to the restored audio signal.

6. The method of claim 5, further comprising:
gradually increasing or reducing a pulse width of the generated pulse according to detected on/off power.

7. An audio power amplifier system, comprising:
- a switching amplifier to generate a pulse width modulation (PWM) signal;
- a pulse generating unit to generate a pulse signal;
- a first low pass filter to low-pass filter the PWM signal to generate an audio signal; and
- a second low pass filter to low-pass filter the pulse signal to convert the pulse signal into a virtual ground voltage to be applied to the first low pass filter.

8. The audio power amplifier system of claim 7, wherein:
the pulse signal has a variable pulse width;
the virtual ground voltage is variable according to the variable pulse width; and
the first low pass filter generates the restored audio signal according to the variable virtual ground voltage.

9. The audio power amplifier system of claim 7, wherein:
the pulse signal has a pulse width which is increased according to a power on signal; and
the first low pass filter comprises a capacitor applied with the virtual ground voltage generated according to the increased pulse width to remove a noise from the restored audio signal.

10. The audio power amplifier system of claim 7, wherein:
the pulse signal has a pulse width which is decreased according to a power off signal; and
the first low pass filter comprises a capacitor applied with the virtual ground voltage generated according to the decreased pulse width to remove a noise from the restored audio signal.

11. The audio power amplifier system of claim 7, wherein:
the pulse signal has a variable duty ratio according to a power on and/or off signal; and
the first low pass filter comprises a capacitor applied with the virtual ground voltage generated according to the variable duty ratio to remove a noise from the restored audio signal.

12. The audio power amplifier system of claim 7, wherein the pulse signal has the same voltage level as the PWM signal.

13. The audio power amplifier system of claim 7, further comprising:
a controlling unit to generate a signal such that the PWM signal and the pulse signal are synchronized.

14. The audio power amplifier system of claim 7, further comprising:
a controlling unit to synchronize the switching amplifier and the pulse generating unit to simultaneously generate the PWM signal and the pulse signal.

15. The audio power amplifier system of claim 7, further comprising
a controlling unit to control the switching amplifier and the pulse generating unit such that the virtual ground voltage is applied to the audio signal to remove a pop-up noise from the audio signal 16. The audio power amplifier system of claim 7, further comprising:
a load unit connected to the first low pass filter to receive the audio signal generated according to the virtual ground voltage, and to produce sound corresponding to the received audio signal.

17. The audio power amplifier system of claim 7, wherein:
the first low pass filter comprises a first inductor and a first capacitor to generate the restored audio signal from the PWM signal; and
the first low pass filter comprises a second inductor and a second capacitor to generate the virtual ground voltage from the pulse signal, and to apply the generated virtual ground voltage to the first capacitor.

18. The audio power amplifier system of claim 7, wherein:
the pulse signal comprises pulses having gradually varying widths;
the virtual ground voltage is adjusted according to the pulses;
the first low pass filter comprises a first capacitor to generate the restored audio signal from the PWM signal; and
the first low pass filter comprises a second capacitor to generate the adjusted virtual ground voltage from the pulses having the gradually varying widths, and to apply the generated adjusted virtual ground voltage to the first capacitor to remove a DC component therefrom.

19. A method of an audio power amplifier system, comprising:
- generating a pulse width modulation (PWM) signal;
- generating a pulse signal;
- low-pass filtering the PWM signal to generate an audio signal; and
- low-pass filtering the pulse signal to convert the pulse signal into a virtual ground voltage to be applied to the low pass filtering of the PWM signal.

20. A computer-readable medium containing computer-readable codes as a program to execute a method of an audio power amplifier system, the method comprising:
- generating a pulse width modulation (PWM) signal;
- generating a pulse signal;
- low-pass filtering the PWM signal to generate an audio signal; and
- low-pass filtering the pulse signal to convert the pulse signal into a virtual ground voltage to be applied to the low pass filtering of the PWM signal.

* * * * *